US009847112B2

(12) United States Patent
Patel

(10) Patent No.: US 9,847,112 B2
(45) Date of Patent: *Dec. 19, 2017

(54) SYNCHRONIZATION OF DATA TRANSMISSION WITH A CLOCK SIGNAL AFTER A MEMORY MODE SWITCH

(71) Applicant: Integrated Device Technology, Inc., San Jose, CA (US)

(72) Inventor: Shwetal Arvind Patel, San Jose, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/386,095

(22) Filed: Dec. 21, 2016

(65) Prior Publication Data

US 2017/0256295 A1 Sep. 7, 2017

Related U.S. Application Data

(63) Continuation of application No. 15/059,555, filed on Mar. 3, 2016, now Pat. No. 9,552,870.

(51) Int. Cl.
| G11C 8/00 | (2006.01) |
| G11C 7/10 | (2006.01) |
| G11C 11/4076 | (2006.01) |
| G11C 11/4093 | (2006.01) |
| G11C 11/4096 | (2006.01) |
| G06F 13/42 | (2006.01) |
| G06F 13/40 | (2006.01) |

(52) U.S. Cl.
CPC ........ G11C 7/1072 (2013.01); G06F 13/4022 (2013.01); G06F 13/4072 (2013.01); G06F 13/4286 (2013.01); G11C 11/4076 (2013.01); G11C 11/4093 (2013.01); G11C 11/4096 (2013.01)

(58) Field of Classification Search
CPC .............. G11C 7/1072; G11C 11/4076; G11C 11/4093; G11C 11/4096; G06F 13/4286; G06F 13/4022; G06F 13/4072
USPC ......... 365/233.1, 194, 198, 233.13; 375/354, 375/358, 295, 316, 222
See application file for complete search history.

(56) References Cited

U.S. PATENT DOCUMENTS

| 8,879,680 | B2 * | 11/2014 | Tresidder ............ G06F 13/4273 375/295 |
| 9,552,870 | B1 * | 1/2017 | Patel ..................... H04L 7/0008 |

* cited by examiner

*Primary Examiner* — David Lam
(74) *Attorney, Agent, or Firm* — Christopher P. Maiorana, PC

(57) ABSTRACT

An apparatus includes a transmitter and a controller. The transmitter may be configured to transmit data stored in a memory. The controller may be configured to (i) train one or more transmit parameters of the transmitter to synchronize transmission of the data with a clock signal while in a first mode, (ii) save the transmit parameters in response to a command received while the transmitter is in the first mode, and (iii) configure the transmitter to transmit the data while in a second mode using the transmit parameters as learned while in the first mode.

20 Claims, 7 Drawing Sheets

SYNCHRONIZATION OF DATA TRANSMISSION WITH A CLOCK SIGNAL AFTER A MEMORY MODE SWITCH

This application relates to U.S. Ser. No. 15/059,555, filed Mar. 3, 2016, now U.S. Pat. No. 9,552,870, which is incorporated by reference in its entirety.

FIELD OF THE INVENTION

The present invention relates to memory and memory controllers generally and, more particularly, to a method and/or apparatus for implementing synchronization after a memory mode switch.

BACKGROUND

Conventional memory controllers train an internal circuit that synchronizes a clock signal to information received from memory chips when the memory chips are in a "delay lock loop (DLL)-on" mode of operation and in a "DLL-off" mode of operation. The training for the different memory modes means dedicated hardware and additional complexity in the memory controllers to account for each mode. Designs of the memory controllers also commonly implement different training processes for each memory mode resulting in more dedicated hardware per mode.

It would be desirable to implement synchronization after a memory mode switch.

SUMMARY

The invention concerns an apparatus including a transmitter and a controller. The transmitter may be configured to transmit data stored in a memory. The controller may be configured to (i) train one or more transmit parameters of the transmitter to synchronize transmission of the data with a clock signal while in a first mode, (ii) save the transmit parameters in response to a command received while the transmitter is in the first mode, and (iii) configure the transmitter to transmit the data while in a second mode using the transmit parameters as learned while in the first mode.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing a method and/or apparatus for synchronization after a memory mode switch that may (i) implement a single set of training hardware and receiver circuits for multiple modes of operation in a memory and a host circuit, (ii) avoid retraining when the memory switches from a DLL-on mode to a DLL-off mode, (iii) reduce or eliminate periodic retraining while the memory is in the DLL-off mode, (iv) train transmit characteristics of the memory in the receiver circuits by periodically changing the memory from the DLL-off mode to the DLL-on mode, (v) implement a dedicated command that instructs the memory to remember and use parameters from the DLL-on mode in the DLL-off mode and/or (vi) be implemented in any host circuit that communicates with the memory.

Various embodiments generally provide reuse of trained transmit parameters (or setting) and trained receive parameters (or setting) in multiple memory modes of operation. The multiple memory modes may include a digital locked loop (DLL)-on mode and a DLL-off mode. The transmit parameters and the receive parameters may be trained (or adjusted) while in the DLL-on mode and reused while in the DLL-off mode. The training of the transmit parameters generally seeks a suitable delay that aligns data transmission with an input clock signal received from an external source. The training of the receive parameters may seek a suitable delay that aligns detection of the transmitted data with the input clock signal.

In the DLL-on mode, the memory may communicate with a host (or device) using a tight timing relationship. The timing relationship is generally maintained by a DLL circuit in the memory that synchronizes data transmissions to the input clock. The memory may train transmit parameters of an internal transmitter circuit to align the data transmissions with edges of the input clock. The host may train receive enable parameters of an internal receiver circuit to identify the received data properly relative to the input clock edges.

In the DLL-off mode, the memory output timing relationship with respect to the input clock may be relaxed over multiple clock cycles. A dedicated command may instruct the memory to continue using the transmit parameters learned in the DLL-on mode while the memory is operating in the DLL-off mode. Even though the input clock frequency may be different in the DLL-off mode compared with the DLL-on mode, the memory generally continues to transmit using tight timing settings as if in the DLL-on mode. The host may avoid retraining the internal receiver circuit to account for the memory in the DLL-off mode. The host may continue to operate as if the memory was in the DLL-on mode.

Figure 1:
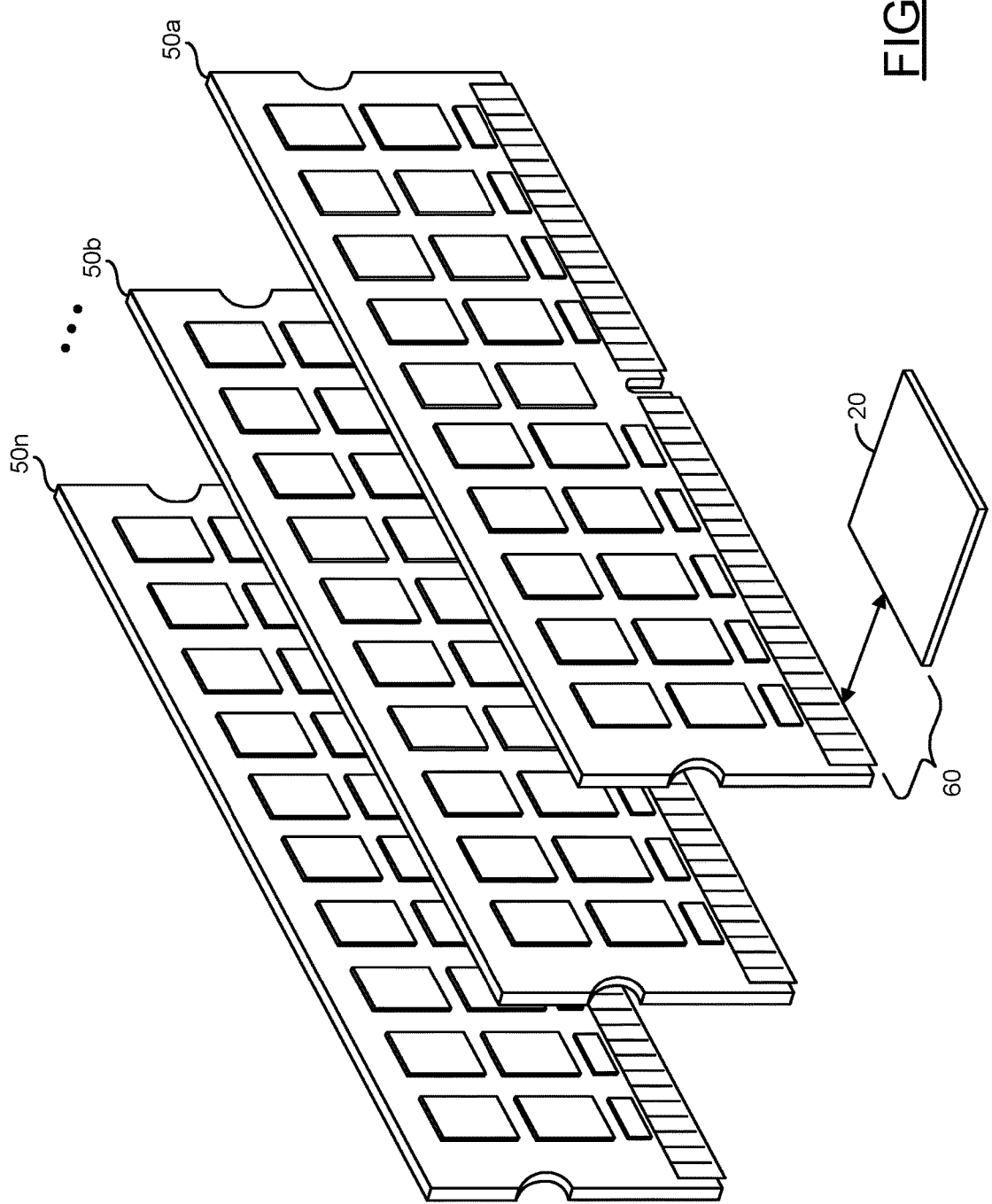
FIG. 1 is a diagram illustrating an embodiment.

Referring to FIG. 1, a diagram illustrating a number of example circuits 50a-50n are shown. In an example, circuits 50a-50n may be implemented as memory modules (or boards). For example, the memory modules 50a-50n may be implemented as double data rate fourth generation (DDR4) synchronous dynamic random-access memory (SDRAM) modules. The memory modules 50a-50n may comprise a number of blocks (or circuits), pins, connectors and/or traces. The type, arrangement and/or number of components of the memory modules 50a-50n may be varied to meet the design criteria of a particular implementation.

The memory modules 50a-50n are shown connected to a block (or circuit) 20. The circuit 20 may be a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard. In another example, the memory controller 20 may be a component of a microprocessor or central processing unit (CPU). In yet another example, the memory controller 20 may be a component of a graphics processing unit (GPU).

In an example, some of the connectors/pins/traces 60 may be part of the memory modules 50a-50n and some of the connectors/pins/traces 60 may be part of the motherboard and/or memory controller 20. The memory modules 50a-50n may be connected to a computer motherboard (e.g., by pins, traces and/or connectors 60) to transfer data between components of a computing device and the memory modules 50a-50n. In an example, the memory controller 20 may be implemented on a northbridge of a motherboard and/or as a component of a microprocessor (e.g., an Intel CPU, an AMD CPU, an ARM CPU, etc.). In another example, the memory controller 20 may be a component of a graphics processor (e.g., nVIDIA GPU, AMD GPU, etc.). The implementation of the memory controller 20 may be varied according to the design criteria of a particular implementation.

The memory modules 50a-50n may be implemented as DDR4 load reduced dual in-line memory modules (LRDIMM), DDR4 registered DIMM (RDIMM), DDR4 unbuffered DIMM (UDIMM), DDR4 small outline DIMM (SODIMM), or DDR4 nonvolatile DIMM (NVDIMM). The NVDIMM configurations may include persistent DRAM NVDIMM (NVDIMM-N), block accessed NAND flash NVDIMM (NVDIMM-F), or persistent and block accessed (NVDIMM-P). In an example, the memory modules 50a-50n may be compliant with the DDR4 specification titled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

Figure 2:
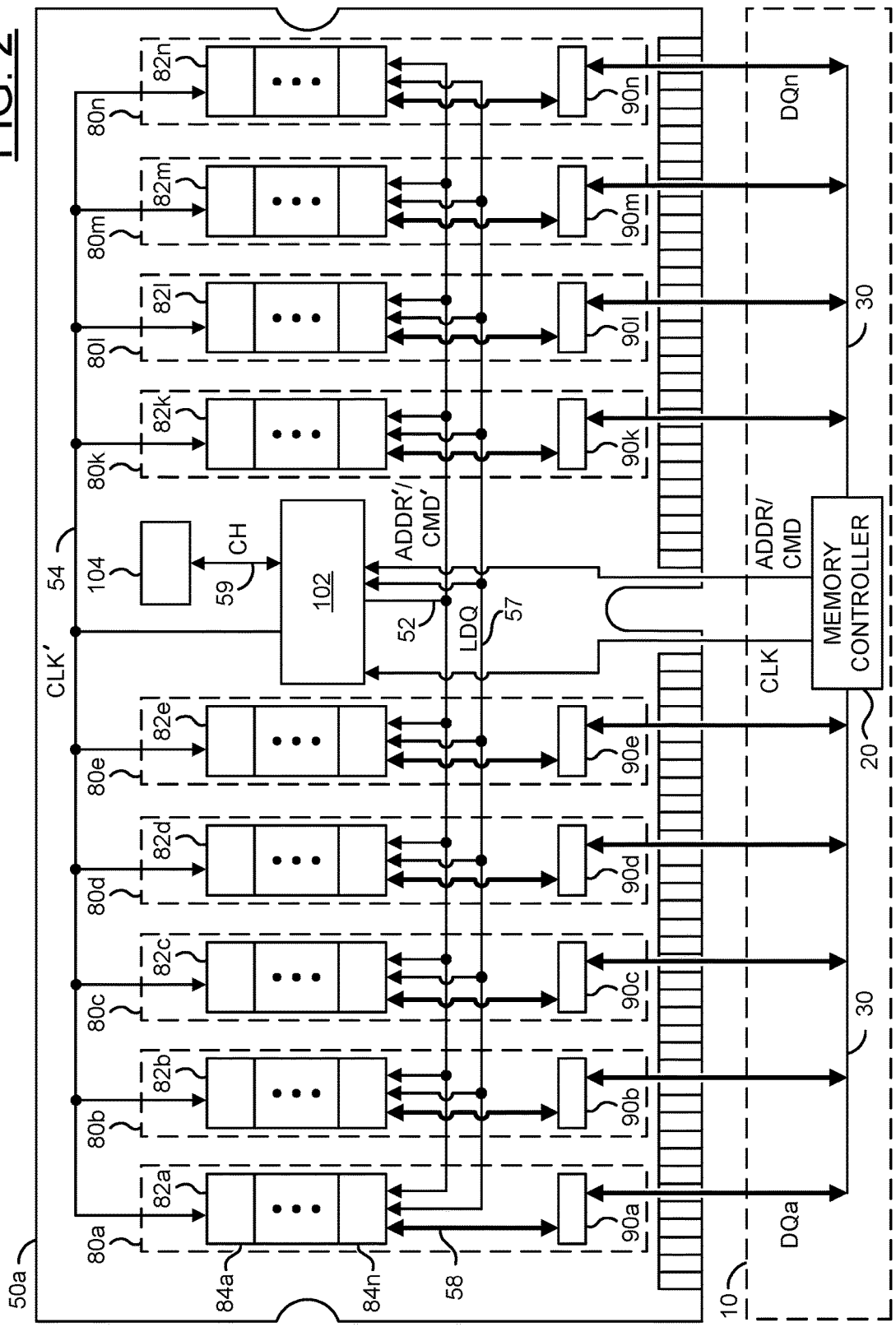
FIG. 2 is a block diagram illustrating a memory module.

Referring to FIG. 2, a block diagram illustrating a memory module 50a is shown. The memory module 50a may be representative of the memory modules 50b-50n. The memory module 50a is shown communicating with the memory controller 20. The memory controller 20 is shown as part of a block (or circuit) 10. The circuit 10 may be a motherboard, or other electronic component or computing engine that communicates with the memory module 50a.

The memory module 50a may comprise one or more blocks (or circuits) 80a-80n, one or more blocks (or circuits) 90a-90n, a block (or circuit) 102 and one or more blocks (or circuits) 104. The circuits 80a-80n may implement data paths of the memory module 50a. For example, the data path 80a may include the circuit 82a and/or the circuit 90a. The data paths 80b-80n may have a similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). In some embodiments, the DRAM chips 84a-84n may be physically located on both sides (e.g., the front and back) of the circuit board of the memory modules 50a-50n. Each of the circuits 90a-90n may implement a data buffer circuit. The circuit 102 may implement a control (or clouds rest (CR)) circuit. The circuit 104 may implement one or more nonvolatile (NV) memory circuits. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the CR circuit 102. A data bus 30 may be connected between the memory controller and the data paths 80a-80n. The memory controller 20 may generate and/or receive data signals (e.g., DQa-DQn) that may be presented/received from the data bus 30. The signals DQa-DQn may be presented to each of the data paths 80a-80n. A data bus 57 may be connected between the DRAM chips 84a-84n in each memory channel 82a-82n and the CR circuit 102. The bus 57 may comprise traces between the DRAM chips 84a-84n and the CR circuit 102. The CR circuit 102 may generate and/or receive data signals (e.g., LDQ) from the data bus 57. A data bus 59 may be connected between the CR circuit 102 and the NV circuit 104. A signal (e.g., CH) may be exchanged between the CR circuit 102 and the NV circuit 104 on the data bus 59.

The CR circuit 102 may be configured to communicate with the memory controller 20, the memory channels 82a-82n, the data buffers 90a-90n and/or the NV memory 104. The CR circuit 102 may provide communications and data exchanges between the NV memory 104 and the DRAM chips 84a-84n and/or between the NV memory 104 and the memory controller 20. The CR circuit 102 may exchange data bidirectionally with the DRAM chips 84a-84n in each memory channel 82a-82n via the signal LDQ on the bus 57. Command and address values may be presented in the signals CMD' and ADDR', respectively, on the bus 52. Bidirectional communication with the NV memory 104 may be provided through the signal CH via the bus 59.

The CR circuit 102 may receive the signal CLK and/or the signals ADDR/CMD from the memory controller 20. Various digital logic components of the CR circuit 102 may be used to generate signals based on the signal CLK and/or the signals ADDR/CMD and/or other signals (e.g., read control words). The CR circuit 102 may also be configured to generate a signal (e.g., CLK') and signals (e.g., ADDR'/CMD'). For example, the signal CLK' may be a signal Y_CLK. The signal CLK' and/or the signals ADDR'/CMD' may be presented to each DRAM chip 84a-84n in each memory channel 82a-82n. For example, the signals CLK' and/or ADDR'/CMD' may be transmitted on common buses 54 and 52, respectively.

The data buffers 90a-90n may be configured to generate/receive data to/from the bus 30 and a bus 58. The bus 30 may comprise traces, pins and/or connections between the memory controller 20 and the data buffers 90a-90n. The bus 58 may carry the data between the data buffers 90a-90n and the memory channels 82a-82n. The data buffers 90a-90n may be configured to buffer data on the buses 30 and 58 for write operations (e.g., data transfers from the memory controller 20 to the corresponding memory channels 82a-82n). The data buffers 90a-90n may be configured to buffer data on the buses 30 and 58 for read operations (e.g., data transfers from the corresponding memory channels 82a-82n to the memory controller 20).

The DRAM chips 84a-84n may be configured to generate/receive data to/from the data bus 57 in units of words (e.g., 8-bit words). The data buffers 90a-90n may exchange data with the DRAM chips 84a-84n in small units (e.g., 4-bit nibbles). In various embodiments, the DRAM chips 84a-84n may be arranged in multiple (e.g., two) sets. For two set/two DRAM chip 84a-84b implementations, each set may contain a single DRAM chips 84a-84n. Each DRAM chip 84A-84b may be connected to the respective data buffers 90a-90n through an upper nibble and a lower nibble. For two set/four DRAM chip 84a-84d implementations, each set may contain two DRAM chips 84a-84d. A set may be connected to the respective data buffers 90a-90n through the upper nibble.

The other set may be connected to the respective data buffers 90a-90n through the lower nibble. For two set/eight DRAM chip 84a-84h implementations, each set may contain four of the DRAM chips 84a-84h. A set of four DRAM chips 84a-84d may connect to the respective data buffers 90a-90n through the upper nibble. The other set of four DRAM chips 84e-84h may connect to the respective data buffers 90a-90n through the lower nibble. Other numbers of sets, other numbers of DRAM chips, and other data unit sizes may be implemented to meet the design criteria of a particular implementation. In some embodiments, the data buffers 90a-90n may be eliminated and the memory controller 20 communicates directly with the DRAM chips 84a-84n in the memory channels 82a-82n.

The NV circuit 104 may be implemented as one or more nonvolatile circuits. In some embodiments, each nonvolatile circuit 104 may implement an embedded multimedia card (eMMC). Each eMMC circuit generally comprises flash memory and an embedded controller. In various embodiments, the flash memory may be implemented as NAND flash memory. In some embodiments, the nonvolatile circuit 104 may be implemented as a universal flash storage (UFS) memory. In other embodiments, the nonvolatile circuit 104 may be implemented as a universal serial bus (USB) memory. Other nonvolatile types of memory may be implemented to meet the criteria of a particular application.

During write operations, data may be written into the DRAM chips 84a-84n of the memory channels 82a-82n via the signals DQa-DQn. Once stored, the data may be copied from the DRAM chips 84a-84n to the CR circuit 102 in the signal LDQ on the data bus 57. The copied data may be identified to the DRAM chips 84a-84n by an address value in the signal ADDR' on the bus 52. The CR circuit 102 may transfer the data in the signal CH on the data bus 59 to the NV memory 104 for storage. The data may also be copied from the NV circuit 104 back to the DRAM chips 84a-84n along the same path. The data may be copied from the NV memory 104 to the CR circuit 102 via the signal CH on the data bus 59. The data may then be transferred in the signal LDQ on the data bus 57 to the DRAM chips 84a-84n for storage at an address value identified in the signal ADD' on the bus 52.

Figure 3:
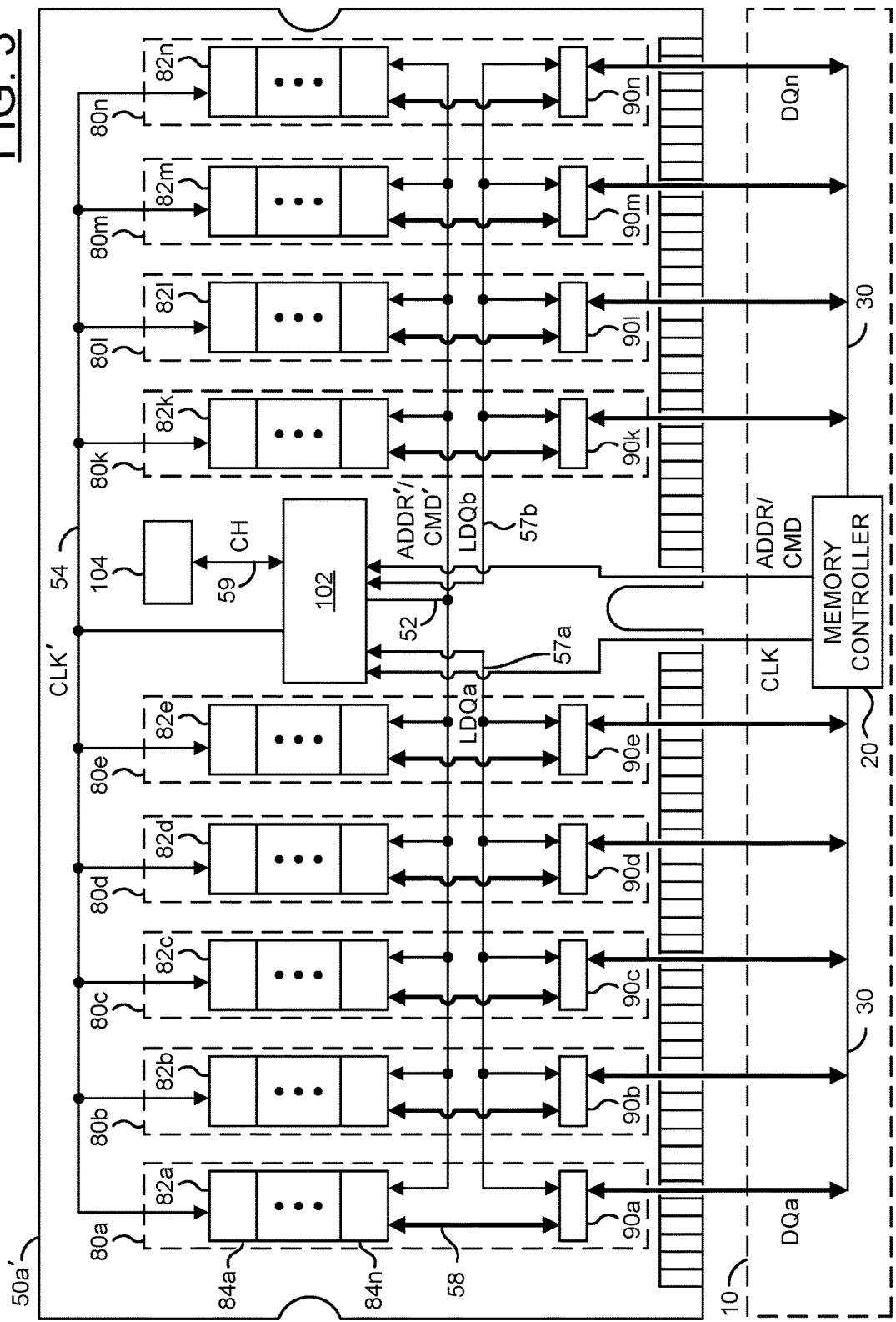
FIG. 3 is a block diagram illustrating another memory module.

Referring to FIG. 3, a block diagram illustrating a memory module 50a' is shown. The memory module 50a' may be a variation of the memory module 50a. The memory module 50a' may comprise the data paths 80a-80n, the memory channels 82a-82n, the DRAM chips 84a-84n, the data buffers 90a-90n, the CR circuit 102 and the NV circuit 104. The data bus 57 of the memory module 50a may be logically viewed as two data busses 57a and 57b in the memory module 50a'. The signal LDQ in the memory module 50a may be logically viewed as two signals (e.g., LDQa and LDQb) in the memory module 50a'. The CR circuit 102 is shown communicating with the data buffers 90a-90n via the data busses 57a and 57b. The data bus 57a may connect the CR circuit 102 to the data buffers 90a-90e with the signal LDQa. The data bus 57b may connect the CR circuit 102 to the data buffers 90k-90n with the signal LDQb.

During write operations, data written into the data buffers 90a-90n via the signals DQa-DQn. From the data buffers 90a-90n, the data my be transferred via the data bus 58 to the DRAM chips 84a-84n of the memory channels 82a-82n. Later, the data may be copied from the DRAM chips 84a-84n to the data buffers 90a-90n. The copied data may be identified to the DRAM chips 84a-84n by an address value in the signal ADDR' on the bus 52. From the data buffers 90a-90n, the data may be transferred to the CR circuit 102 in the signals LDQa/LDQb on the data busses 57a/57b, respectfully. The CR circuit 102 may transfer the data in the signal CH on the data bus 59 to the NV memory 104 for storage. The data may also be copied from the NV circuit 104 back to the DRAM chips 84a-84n along the same path. The data may be copied from the NV memory 104 to the CR circuit 102 via the signal CH on the data bus 59. The data may then be transferred in the signals LDQa/LDQb on the data busses 57a/57b to the data buffers 90a-90n. From the data buffers 90a-90n, the data may be transferred to the DRAM chips 84a-84n for storage at an address value identified in the signal ADD' on the bus 52.

Figure 4:
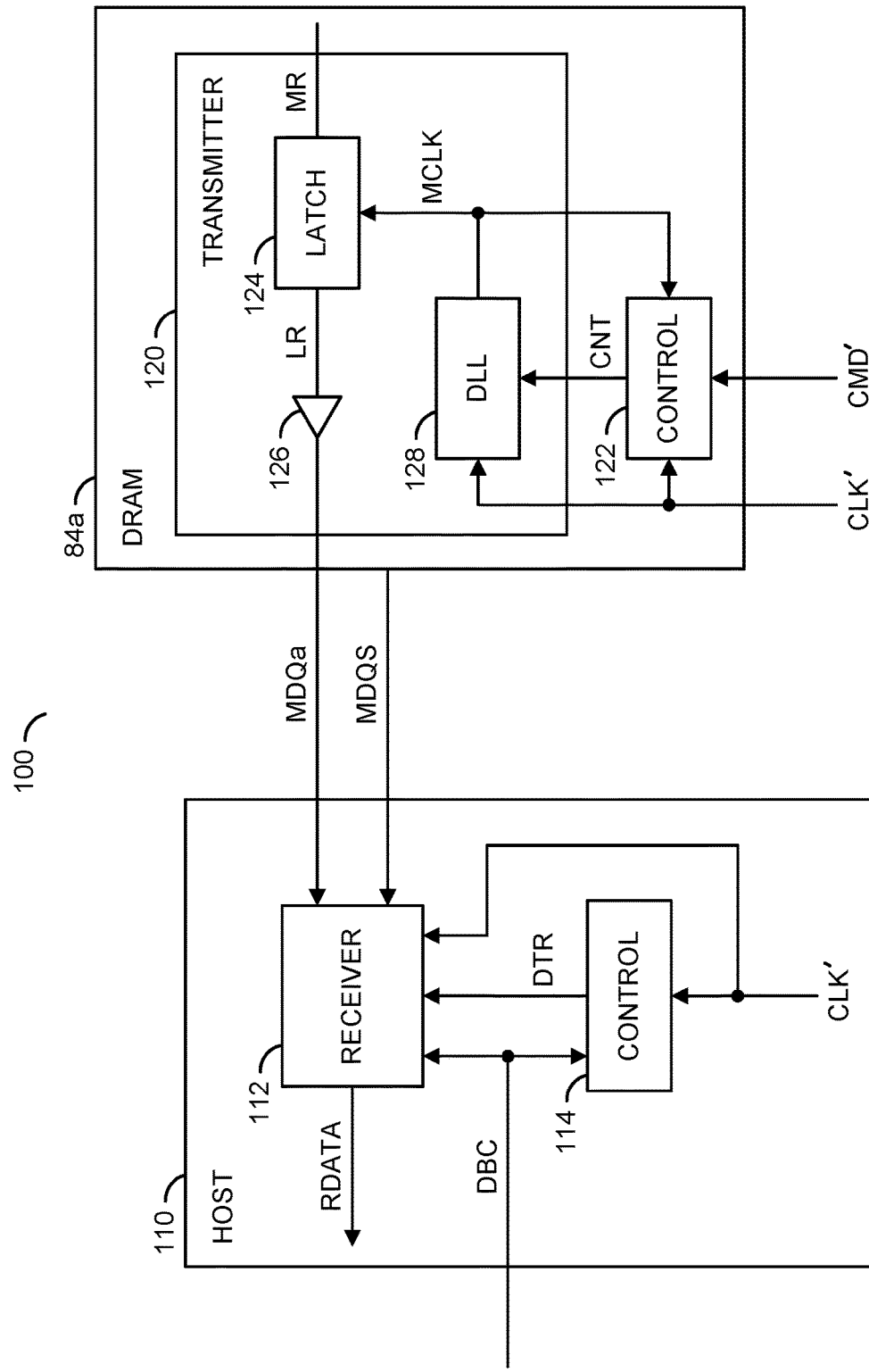
FIG. 4 is a block diagram of a system in accordance with an embodiment of the present invention.

Referring to FIG. 4, a block diagram of an example implementation of a system (or apparatus or circuit) 100 is shown in accordance with an embodiment of the present invention. The system 100 generally comprises one or more of the DRAM chips 84-84n (one DRAM chip 84a is shown for clarity) and a block (or circuit) 110. The circuit 110 may include a block (or circuit) 112 and a block (or circuit) 114. The DRAM chip 84a may include a block (or circuit) 120 and a block (or circuit) 122. The circuit 120 generally comprises a block (or circuit) 124, a block (or circuit) 126 and a block (or circuit) 128.

The circuit 110 may implement a host circuit that is in direct communication with the DRAM chip 84a. In various embodiments, multiple copies of the host circuit 110 may be implemented in one or more of several possible devices. In some embodiments, the host circuit 110 may be instantiated in the CR circuit 102, a host circuit 110 for each bit on the data bus 57 or 57a/57b. In other embodiments, the host circuit 110 may be instantiated in each data buffer 90a-90n, a host circuit 110 for each bit on each bus 58. Other numbers of the host circuit 110 and other locations of the host circuit 110 may be implemented to meet the design criteria of a particular application.

A data signal (e.g., MDQa) may be generated by the circuit 126 and received by the circuit 112. The signal MDQA may carry data read from the DRAM chip 84a. In various embodiments, the signal MDQa may be part of the signal LDQ/LDQa on the bus 57/57a or part of a signal on the bus 58. A signal (e.g., MDQS) may be generated by the DRAM chip 84a and received by the circuit 112. The signal MDQS may carry a strobe for the data in the signal MDQa.

The circuit 112 may generate and present a read data signal (e.g., RDATA). The signal RDATA may convey a copy of the read data received in the signal MDQa. A signal (e.g., DTR) may be generated by the circuit 114 and transferred to the circuit 112. The signal DTR may carry the host training parameters for the circuit 112. The signal CLK' may be received by the circuits 112 and 114. Where the host circuit 110 is implemented in the data buffers 90a-90n, a signal (e.g., DBC) may be received by the circuits 112 and 114. The signal DBC may contain control information used to configure the host circuit 110.

The signal CLK' may be generated by the CR circuit 102 and received by the circuits 122 and 128. The signal CMD' may be generated by the CR circuit 102 and transferred to the circuit 122. The signal CMD' may contain control information used to configure the modes and the transmission characteristics of the DRAM chip 84a. The circuit 122 may generate a signal (e.g., CNT) received by the circuit 128. The signal CNT may carry transmit parameters used to control the transmission of the data in the signal MDQa. The circuit 128 may generate a local clock signal (e.g., MCLK) transferred to the circuits 122 and 124. The signal MCLK may be a delayed version of the signal CLK'. A signal (e.g., MR) may be received by the circuit 124. The signal MR may convey memory read data from memory cells inside the DRAM chip 84*a*. A signal (e.g., LR) may be generated by the circuit 124 and received by the circuit 126. The signal LR may be a latched version of the data in the signal MR.

The host circuit 110 may be operational to receive data from the DRAM chip 84*a* and present that data in the signal RDATA. The host circuit 110 may be configured to train one or more of the receive parameters of the circuit 112 that synchronize reception of the data in the signal MDQa with the clock signal CLK' while the DRAM chip 84*a* is in the DLL-on mode. The host circuit 110 may also be configured to receive additional data in the signal MDQa from the DRAM chip 84*a* while the DRAM chip 84*a* is in the DLL-off mode using the receive parameters as learned while the DRAM chip 84*a* was in the DLL-on mode.

The circuit 112 may implement a receiver circuit. The circuit 112 is generally operational to recover data in the signal MDQa based on the strobe signal MDQS and edges in the clock signal CLK'. The recovered data may be presented in the signal RDATA.

The circuit 114 may implement a control circuit. The circuit 114 is generally operational to train the receive parameters of the receiver circuit 112. The training may be performed while the DRAM chip 84*a* is in the DLL-on mode. The circuit 114 may be further operational to store the receive parameters in response to a dedicated command received in the signal DBC. The circuit 114 may optionally read the stored receive parameters and configure the receiver circuit 112 when the DRAM chip 84*a* is commanded into the DLL-off mode.

A frequency of the signal CLK' may be varied. While the DRAM chip 84*a* is in the DLL-on mode, the frequency of the signal CLK' may be fixed. While the DRAM chip 84*a* is in a self refresh mode (or state), the frequency of the signal CLK' may be changed. While the DRAM chip 84*a* is in the DLL-off mode, the frequency of the signal CLK' may be fixed. The frequency of the signal CLK' may be lower while the DRAM chip 84*a* is in the DLL-off mode than the frequency while the DRAM chip 84*a* is in the DLL-on mode.

The circuit 120 may implement a transmitter circuit. The circuit 120 is generally operational to delay the data in the signal MR to be synchronous with the signal CLK'. The synchronization may include generation of the internal memory clock signal MCLK based on the transmit parameters learned while in the DLL-on mode. The circuit 120 may transmit data while in the DLL-on mode with timing governed by the signal MCLK. Additional data may be transmitted by the circuit 120 while in the DLL-off mode using the timing of the signal MCLK and based on transmit parameters learned while in the DLL-on mode.

The circuit 122 may implement a control circuit. The circuit 122 is generally operational to train the one or more transmit parameters of the circuit 120 via the signal CNT. The training may include a phase comparison between the clock signal CLK' and the internal clock signal MCLK. A predetermined phase shift (or time delay) may be established between the clock signals CLK' and MCLK such that the circuit 120 synchronizes transmission of the data with the clock signal CLK' while in the DLL-on mode. The circuit 122 may save the transmit parameters in response to a particular command (e.g., a freeze-and-snap command: freeze the DLL-on transmit parameters and the DLL-on receive parameters; and snap the parameters to registers) received while in the DLL-on mode. After being switched to the DLL-off mode, the circuit 122 may recall the saved transmit parameters learned while in the DLL on mode and program the transmitter circuit 120 with the parameters.

The circuit 124 may implement a latch circuit. The circuit 124 is generally operational to latch (or temporarily buffer) the data received in the signal MR. The latched data may be presented in the signal LR with timing determined by the signal MCLK.

The circuit 126 may implement a driver circuit. The circuit 126 is generally operational to drive the data received in the signal LR onto a bus as the signal MDQa. In some embodiments, the bus may be the bus 57. In various embodiments, the bus may be the bus 58.

The circuit 128 may implement a delayed lock loop circuit. The DLL circuit 128 is generally operational to delay the clock signal CLK' to generate the clock signal MCLK. A length of the delay may be programmable and based on the one or more transmit parameters in the signal CNT. The DRAM chip 84*a* may be in the DLL-on mode while a lag from the signal CLK' to the signal MCLK is a predetermined time and a combination of the DLL circuit 128 and the control circuit 122 cause the signal MCLK to track frequency changes in the signal CLK'. The DRAM chip 84*a* may be in the DLL-off mode while the combination of the DLL circuit 128 and the control circuit 122 allow the signal MCLK to break track with the signal CLK'.

Figure 5:
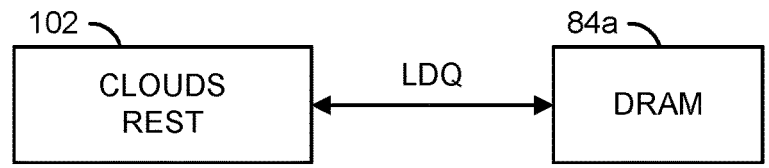
FIG. 5 is a block diagram of an interface between a memory chip and a control circuit.

Referring to FIG. 5, a block diagram of an example configuration of an interface between the DRAM chip 84*a* and the CR circuit 102 is shown. The configuration illustrated may be similar to that shown in FIG. 2. In various embodiments, the CR circuit 102 may be in direct communication with the DRAM chips 84*a*-84*n*.

Figure 6:
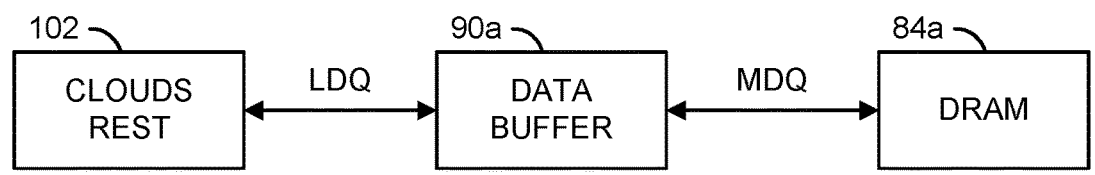
FIG. 6 is a block diagram of an interface between the memory chip and a data buffer.

Referring to FIG. 6, a block diagram of an example configuration of an interface between the DRAM chip 84*a* and the CR circuit 102 with the data buffer circuits 90*a*-90*n* is shown. The configuration illustrated may be similar to that shown in FIG. 3. In various embodiments, the CR circuit 102 may be in communication with the DRAM chips 84*a*-84*n* through the data buffer circuits 90*a*-90*n*.

Training of the receiver circuit 112 may be based on a configuration of the memory subsystem. In the DLL-on mode, the CR circuit 102 generally trains the receiver circuit 112 within the CR circuit 102 based on the output timing of the DRAM chips 84*a*-84*n*. In some environments, the CR circuit 102 may also train the receiver circuit 112 in the data buffer circuits 90*a*-90*n* based on the output timing of the DRAM chips 84*a*-84*n*. During a memory mode switch from the DLL-on mode to the DLL-off mode, the CR circuit 102 and/or the data buffer circuits 90*a*-90*n* may maintain the receive parameters of each receiver circuit 112 the same as learned during the DLL-on mode. While the DRAM chips 84*a*-84*n* are in the DLL-off mode, the CR circuit 102 and/or the data buffer circuits 90*a*-90*n* may maintain the receive parameters of each receiver circuit 112 the same as learned during the DLL-on mode.

After the freeze-and-snap command is issued to the DRAM chips 84*a*-84*n*, when the DRAM chips 84*a*-84*n* exit out of the self refresh state, timing in the DLL-off mode may be similar or identical to the timing in the DLL-on mode. For a read data clock to data strobe relationship (tDQSCK), specified minimum timing uncertainties and specified maximum timing uncertainties generally apply. In various embodiments, a command address strobe latency (CL) may be the same as or different in the DLL-off mode compared with the DLL-on mode.

Figure 7:
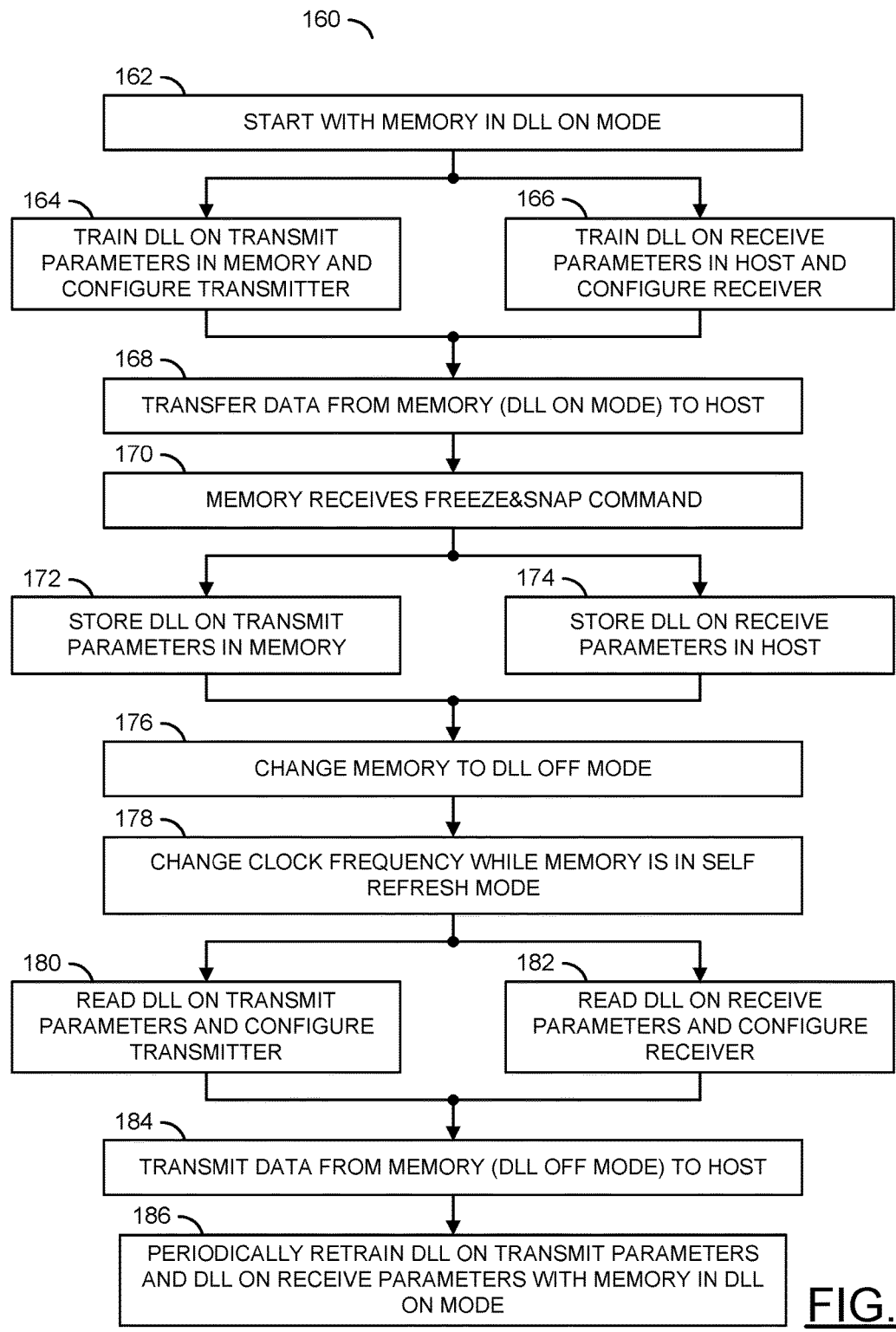
FIG. 7 is a flow diagram of method for mode change.

Referring to FIG. 7, a flow diagram of an example method 160 for mode change is shown. The method (or process) 160 may by implemented in the DRAM chips 84*a*-84*n* and one or more host circuits 110 (e.g., the data buffer circuits 90a-90n and/or the CR circuit 102). The method 160 generally comprises a step (or state) 162, a step (or state) 164, a step (or state) 166, a step (or state) 168, a step (or state) 170, a step (or state) 172, a step (or state) 174, a step (or state) 176, a step (or state) 178, a step (or state) 180, a step (or state) 182, a step (or state) 184, and a step (or state) 186.

A mode switch of the DRAM chips 84a-84n from the DLL-on mode to the DLL-off mode commonly starts with the DRAM chips 84a-84n in an idle state (see paragraph 4.4.2. of the "DDR4 SDRAM" specification.) The freeze-and-snap command may be issued to the DRAM chips 84a-84n to instruct the DRAM chips 84a-84n to save the DLL-on transmit parameters. A mode register 1 (MR1) bit AO may be set to "0" to disable the DLL circuits 128 thereby placing the DRAM chips 84a-84n in the DLL-off mode. The DRAM chips 84a-84n operating in the DLL-off mode, may continue to use the transmit parameters learned while in the DLL-on mode to communicate with the host circuit 110. The DRAM chips 84a-84n may subsequently be put in a self refresh state. A frequency of the clock signal CLK may be changed during the self refresh state. After the clock signal CLK is stable at the new frequency, a Self Refresh Exit command may be issued to the DRAM chips 84a-84n. After some period, the DRAM chips 84a-84n may be ready for operation.

At a beginning step 162 of the method 160, a DRAM chip (e.g., chip 84a) may start in the DLL-on mode. The control circuit 122 of the DRAM chip 84a may train the DLL-on transmit parameters of the transmitter circuit 120 in the step 164. In parallel, or sequentially to the step 164, the control circuit 114 of the host circuit 110 may train the DLL-on receive parameters of the receiver circuit 112 in the step 166. Once both the transmitter circuit 120 and the receiver circuit 112 have been trained, the DRAM chip 84a may transfer data in the signal MDQa to the host circuit 110 using the DLL-on transmit parameters in the transmitter circuit 120. The host circuit 110 may use the DLL-on receive parameters in the receiver circuit 112.

In the step 170, the control circuits 114 and 122 may receive the freeze-and-snap command. The control circuit 114 may optionally receive the freeze-and-snap command in the signal DBC. The control circuit 122 may receive the freeze-and-snap command in the signal CMD'. The control circuit 122 may store the DLL-on transmit parameters in the step 172. In parallel with, or sequential to step 172, the control circuit 114 may optionally store the DLL-on receive parameters in the step 174.

In the step 176, the mode of the DRAM chips 84a-84n may be changed to the DLL-off mode. In the step 178, a frequency of the clock signal CLK' may be changed to a lower frequency. The lower frequency generally saves power consumed by the DRAM chips 84a-84n. Once in the DLL-off mode, in the step 180 the control circuit 120 may read the transmit parameters determined and stored while in the DLL-on mode. The transmit parameters may be presented to the transmitter circuit 122 if the transmitter circuit 122 does not retain the DLL-on parameters while in the refresh state. In parallel with, or sequential to the step 180, the control circuit 114 may optionally read the receive parameters determined and stored while the DRAM chip 84a was in the DLL-on mode in the step 182. The receive parameters may be presented to the receiver circuit 112 if the receiver circuit 112 does not retain the DLL-on parameters while in the refresh state.

In the step 184, the transmitter circuit 120 may transmit more data to the host circuit 110. Although the DRAM chip 84a is in the DLL-off mode, the transmitter circuit 120 may use the DLL-on transmit parameters. The receiver circuit 112 may receive the additional data from the transmitter circuit 120. The receiver circuit 112 generally uses the DLL-on transmit parameters though the DRAM chip 84a is in the DLL-off mode. Since the host circuit 110 and the DRAM chip 84a use the same DLL-on parameters while in the DLL-on mode and the DLL-off mode, a single set of hardware may be implemented in the host circuit 110 to learn the DLL-on parameters.

The DLL-on parameters may be used while in the DLL-off mode for a few seconds to several minutes (e.g., 3 minutes), depending on a rate of drift of temperature and voltages. While in the DLL-off mode, the host circuit 110 and the DRAM chip 84a may periodically enter the DLL-on mode for a while in the step 186 to retrain the receive parameters and the transmit parameters to account for any temperature and/or voltage drift. Once the retraining is complete, the host circuit 110 and the DRAM chip 84a generally resume operation in the DLL-off mode. Transition of the host circuit 110 and the DRAM chip 84a from the DLL-off mode back to the DLL-on mode may be achieved by issuing a DLL-on command.

The freeze-and-snap command may be implemented using existing reserved-for-user (RFU) bits in the mode register. In various embodiments, the freeze-and-snap command may be created by programming any one or more of the A17, A13, A6 and/or A5 bits in the MR1. The freeze-and-snap command may be issued at the same time as the disable-DLL command through the AO address bit. In some embodiments, the freeze-and-snap command may be created by defining bits in the RFU command (see section 4.1 in the "DDR4 SDRAM" specification). The freeze-and-snap command may be transferred on ADDR/CMD bus. The modified RFU command may also be used to disable the DLL circuit 128. Other implementations of the freeze-and-snap command may be implemented to meet the design criteria of a particular application.

Figure 8:
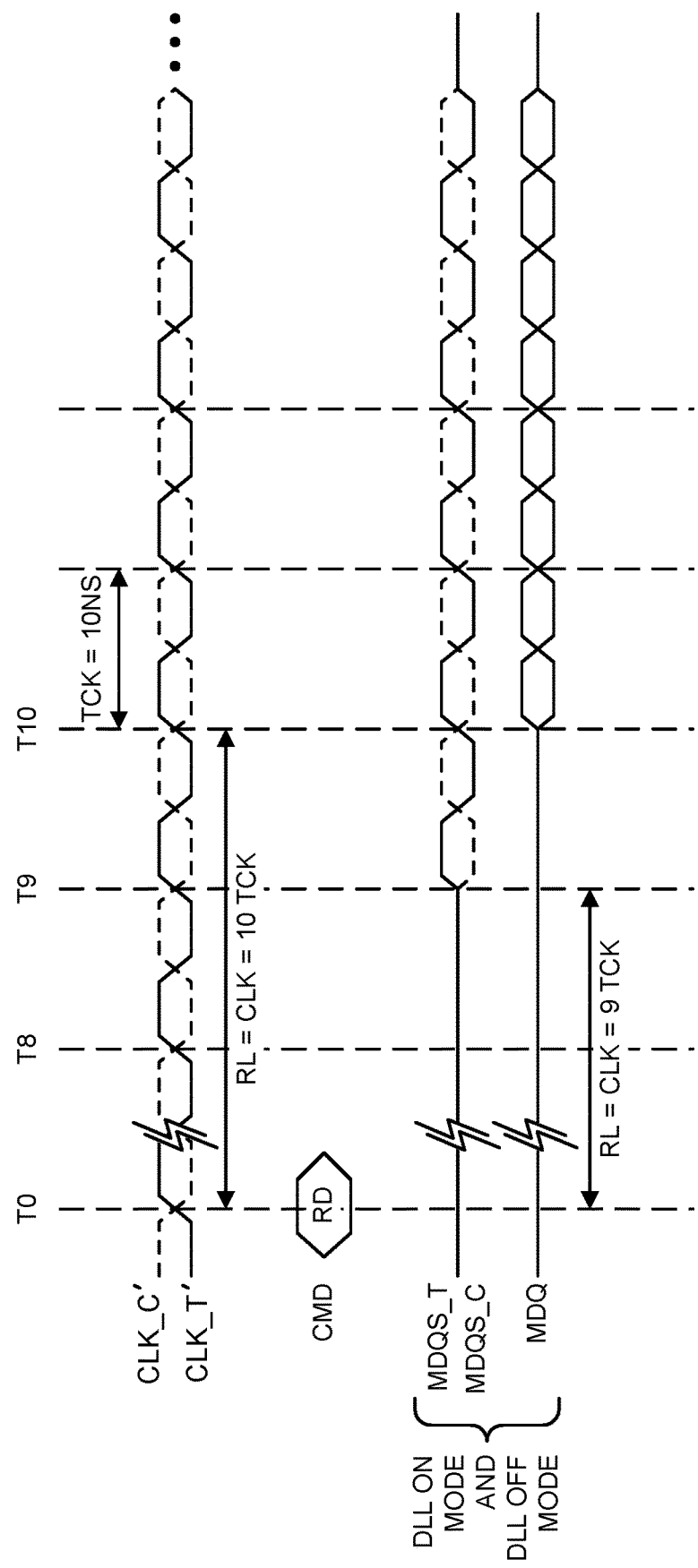
FIG. 8 is a graph of signal timing for a read operation.

Referring to FIG. 8, a graph of example signal timing for a read operation is shown. A read command (RD) may be issued at an initial time (e.g., a time T0). Each clock cycle may have a fixed period, labeled TCLK (e.g., 10 nanoseconds in the example). During a read latency of several (e.g., 9) clock cycles (e.g., until a time T9), the DRAM chip 84a may not drive the data strobe signal MDQS (show as a differential signal MDQS_T and MDQS C) while the data is being read from memory cells. At a later time (e.g., T9), the DRAM chip 84a may cycle the strobe signal MDQS during a preamble window. The host circuit 110 may turn on the internal receiver circuit 112 during the preamble window. The preamble window is usually a single cycle of the input clock CLK' (shown as a differential signal CLK_T' and CLK_C'). The host circuit 110 may train a receiver enable time while the DRAM chip 84a is in the DLL-on mode. At the next time (e.g., T10), the DRAM chip 84a may begin sending data in the signal MDQ. Each data item may be synchronized with the signal CLK' and so synchronized with the signal CLK. Various embodiments of the invention may have a single set of training hardware and processes for the DLL-on mode and reuse that hardware and processes for DLL-off mode operation.

The freeze-and-snap command may be applied to the DRAM chips 84a-84n. The freeze-and-snap command may be issued to the DRAM chips 84a-84n shortly before the DRAM chips 84a-84n are placed in the self refresh state to switch to the DLL-off mode of operation. The freeze-andsnap command may be issued in the DLL-on mode with the DLL circuit 128 fully locked to the clock signals CLK and CLK'.

A relatively constant voltage/temperature environment may be expected during a reasonable time constraint with some drift on voltage/temperature. By reusing the DLL-on receive parameters, retraining of the receiver enable capability of the CR circuit 102 and/or the data buffers 90a-90n may be avoided when the DRAM chips 84a-84n are switched from the DLL-on mode to the DLL-off mode. The technique of the invention may lessen or eliminate periodic retraining of the receive enable capability while the DRAM chips 84a-84n are in the DLL-off mode. While using the DRAM chips 84a-84n in the DLL-off mode, the periodic retraining in the DLL-on mode may be at a reasonable interval to compensate for voltage and/or temperature drift. A reasonable interval generally depends on system voltage/temperature drift characteristics. The receive enable retraining may be accomplished by putting the DRAM chips 84a-84n in the DLL-on mode for a sufficient time for the DRAM chips 84a-84n to calibrate an output timing of the data signals.

While FIG. 4 shows the receiver/control circuits 112/114 in the context of the CR circuit 102 and/or the data buffers 90a-90a while receiving information, copies of the receiver/control circuits 112/114 may be implemented at other locations, other data paths and/or other control paths. Copies of the transmitter/control circuits 120/122 may also be implemented in other locations, other data paths and/or other control paths. In some embodiments, copies of the transmitter/control circuits 120/122 may be located in the data buffer circuits 90a-90n to synchronize the signals sent from the data buffer circuits 90a-90n to the memory controller 20 and/or the host processors 22. In various embodiments, copies of the receiver/control circuits 112/114 and/or the transmitter/control circuits 120/122 may be located at the other ends of the data bus 30 and/or the bus 58 to improve various signals timing for communications across the busses. Instances of the receiver/control circuits 112/114 and/or the transmitter/control circuits 120/122 may also be implemented in other circuitry within the memory modules 50a-50n.

Although embodiments of the invention have been described in the context of a DDR4 application, the present invention is not limited to DDR4 applications, but may also be applied in other memory technology interfaces. The present invention may also be applicable to memory systems implemented in compliance with either existing (legacy) memory specifications or future memory specifications.

The functions and structures illustrated in the diagrams of FIGS. 1 to 8 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
  a transmitter configured to transmit data stored in a memory; and
  a controller configured to (i) train one or more transmit parameters of said transmitter to synchronize transmission of said data with a clock signal while in a first mode, (ii) save said transmit parameters in response to a command received while said transmitter is in said first mode, and (iii) configure said transmitter to transmit said data while in a second mode using said transmit parameters as learned while in said first mode.

2. The apparatus according to claim 1, wherein said first mode is a DLL-on mode and said second mode is a DLL-off mode.

3. The apparatus according to claim 1, wherein said controller is configured to change said transmitter from said first mode to said second mode after said transmit parameters are saved.

4. The apparatus according to claim 1, wherein said controller is further configured to (i) change said transmitter from said second mode to said first mode, (ii) retrain said transmit parameters while in said first mode and (iii) change said transmitter from said first mode back to said second mode after said transmit parameters are retrained.

5. The apparatus according to claim 1, wherein said transmitter is configured to break synchronization with said clock signal while in said second mode.

6. The apparatus according to claim 1, wherein a frequency of said clock signal is higher in said first mode than in said second mode.

7. The apparatus according to claim 1, further comprising:
  a receiver configured to receive said data from said transmitter; and
  a circuit configured to (i) train one or more receive parameters of said receiver to synchronize reception of said data with said clock signal while in said first mode and (ii) configure said receiver to receive said data from said transmitter while in said second mode using said receive parameters as learned while in said first mode.

8. The apparatus according to claim 7, wherein said circuit maintains a single mode of operation while said transmitter is in said first mode and said second mode.

9. The apparatus according to claim 1, wherein said controller and said transmitter form part of a double data rate fourth generation (DDR4) dynamic random access memory (DRAM) chip.

10. The apparatus according to claim 1, wherein said controller and said transmitter form part of a double data rate fourth generation (DDR4) nonvolatile dual in-line memory module (NVDIMM).

11. A method for synchronization after a memory mode switch, comprising the steps of:
  storing data in a memory;
  training one or more transmit parameters of a transmitter to synchronize transmission of said data with a clock signal while in a first mode;
  saving said transmit parameters in response to a command received by a controller while said transmitter is in said first mode; and
  configuring said transmitter to transmit said data while in a second mode using said transmit parameters as learned while in said first mode.

12. The method according to claim 11, wherein said first mode is a DLL-on mode and said second mode is a DLL-off mode.

13. The method according to claim 11, further comprising the step of:
  changing said transmitter from said first mode to said second mode after said transmit parameters are saved.

14. The method according to claim 11, further comprising the steps of:
  changing said transmitter from said second mode to said first mode;
  retraining said transmit parameters while in said first mode; and
  changing said transmitter from said first mode back to said second mode after said transmit parameters are retrained.

15. The method according to claim 11, further comprising the step of:
  breaking synchronization with said clock signal while said transmitter is in said second mode.

16. The method according to claim 11, wherein a frequency of said clock signal is higher in said first mode than in said second mode.

17. The method according to claim 11, further comprising the steps of:
  receiving said data at a receiver;
  training one or more receive parameters of said receiver with a circuit to synchronize reception of said data with said clock signal while in said first mode; and
  configuring said receiver to receive said data from said transmitter while in said second mode using said receive parameters as learned while in said first mode.

18. The method according to claim 17, wherein said circuit maintains a single mode of operation while said transmitter is in said first mode and said second mode.

19. The method according to claim 17, wherein said receiver forms part of a data buffer circuit in communication with said transmitter across a data bus.

20. The method according to claim 17, wherein said receiver forms part of a control circuit in communication with said transmitter across a data bus.

* * * * *